United States Patent
Wu et al.

(10) Patent No.: US 11,929,716 B2
(45) Date of Patent: Mar. 12, 2024

(54) SENSE AMPLIFIER, MEMORY AND METHOD FOR CONTROLLING SENSE AMPLIFIER

(71) Applicants: ANHUI UNIVERSITY, Anhui (CN); CHANGXIN MEMORY TECHNOLOGIES, INC., Hefei (CN)

(72) Inventors: Xiulong Wu, Hefei (CN); Li Zhao, Hefei (CN); Yangkuo Zhao, Hefei (CN); Jun He, Hefei (CN); Xin Li, Hefei (CN); Zhan Ying, Hefei (CN); Kanyu Cao, Hefei (CN); Wenjuan Lu, Hefei (CN); Chunyu Peng, Hefei (CN); Zhiting Lin, Hefei (CN); Junning Chen, Hefei (CN)

(73) Assignees: ANHUI UNIVERSITY, Anhui (CN); CHANGXIN MEMORY TECHNOLOGIES, INC., Anhui (CN)

(*) Notice: Subject to any disclaimer, the term of this patent is extended or adjusted under 35 U.S.C. 154(b) by 305 days.

(21) Appl. No.: 17/472,778

(22) Filed: Sep. 13, 2021

(65) Prior Publication Data
US 2022/0029586 A1     Jan. 27, 2022

Related U.S. Application Data

(63) Continuation of application No. PCT/CN2020/139642, filed on Dec. 25, 2020.

(30) Foreign Application Priority Data

Jul. 27, 2020    (CN) .......................... 202010734507.5

(51) Int. Cl.
*G11C 7/08*      (2006.01)
*G11C 7/06*      (2006.01)
(Continued)

(52) U.S. Cl.
CPC ............... *H03F 1/26* (2013.01); *G11C 7/062* (2013.01); *G11C 7/08* (2013.01); *G11C 7/1069* (2013.01); *G11C 7/12* (2013.01); *H03F 2200/375* (2013.01)

(58) Field of Classification Search
CPC ................. H03F 1/26; H03F 2200/375; H03F 2203/45212; H03F 3/45744; G11C 7/062;
(Continued)

(56) References Cited

U.S. PATENT DOCUMENTS

2006/0050584 A1    3/2006   Gogl
2011/0019493 A1*   1/2011   Ikeda .................. G11C 7/12
                                                       365/207

FOREIGN PATENT DOCUMENTS

CN       209168744 U     7/2019
CN       210575115 U     5/2020
CN       111863053 A     10/2020

* cited by examiner

*Primary Examiner* — Mohammed A Bashar
(74) *Attorney, Agent, or Firm* — Cooper Legal Group, LLC

(57) ABSTRACT

The disclosure provides a Sense Amplifier (SA), a memory and a method for controlling the SA, and relates to the technical field of semiconductor memories. The SA includes: an amplifier module; an offset voltage storage unit electrically connected to the amplifier module and configured to store an offset voltage of the amplifier module in an offset elimination stage of the SA; and a load compensation unit electrically connected to the amplifier module and configured to compensate a difference between loads of the amplifier module in an amplification stage of the SA. The disclosure may improve an accuracy of reading data of the SA.

18 Claims, 11 Drawing Sheets

(51) Int. Cl.
  *G11C 7/10* (2006.01)
  *G11C 7/12* (2006.01)
  *H03F 1/26* (2006.01)
(58) Field of Classification Search
  CPC ........... G11C 7/08; G11C 7/1069; G11C 7/12; G11C 7/065; G11C 11/4091; G11C 11/4094
  See application file for complete search history.

US 11,929,716 B2

SENSE AMPLIFIER, MEMORY AND METHOD FOR CONTROLLING SENSE AMPLIFIER

CROSS-REFERENCE TO RELATED APPLICATIONS

This is a continuation application of International Application No. PCT/CN2020/139642, filed on Dec. 25, 2020, which claims priority to Chinese Patent Application No. 202010734507.5, filed on Jul. 27, 2020 and entitled "SENSE AMPLIFIER, MEMORY AND METHOD FOR CONTROLLING SENSE AMPLIFIER". The disclosures of International Application No. PCT/CN2020/139642 and Chinese Patent Application No. 202010734507.5 are hereby incorporated by reference in their entireties.

TECHNICAL FIELD

The disclosure relates to the technical field of semiconductor memories, and more particularly, to a Sense Amplifier (SA), a memory and a method for controlling the sense amplifier.

BACKGROUND

With the popularization of electronic devices such as mobile phones, tablets and personal computers, semiconductor memory technologies are also developed quickly. For example, memories such as the Dynamic Random Access Memory (DRAM) and Static Random-Access Memory (SRAM) have the advantages of high density, low power consumption, low price and the like, and have been widely applied to various electronic devices.

As an important part of the semiconductor memory, the SA mainly functions to amplify a small signal on a bit line, thereby executing a read or write operation. With the continuous improvement of the technologies, a size of the semiconductor memory is increasingly reduced. In this case, an offset voltage caused by mismatch of transistors in the SA is increasingly large, which will seriously affect the performance of the semiconductor memory.

In some offset compensation solutions, although the offset voltage is inhibited, a problem of reading data in error may still occur due to defects of a circuit structure.

It is to be noted that the information disclosed in the background section is merely for the purpose of enhancing the understanding on the background of the disclosure and thus may include information which does not constitute conventional art known to those of ordinary skill in the art.

SUMMARY

An objective of the disclosure is to provide an SA, a memory and a method for controlling the SA, so as to at least overcome, to some extent, the problem that the SA reads data in error due to limitations and defects in the related art.

According to a first aspect of the disclosure, an SA is provided, which includes: an amplifier circuit; an offset voltage storage circuit electrically connected to the amplifier circuit, and configured to store an offset voltage of the amplifier circuit in an offset elimination stage of the SA; and a load compensation circuit electrically connected to the amplifier circuit, and configured to compensate a difference between loads of the amplifier circuit in an amplification stage of the SA.

According to a second aspect of the disclosure, a memory is provided, which includes an SA, and the SA includes: an amplifier circuit; an offset voltage storage circuit electrically connected to the amplifier circuit, and configured to store an offset voltage of the amplifier circuit in an offset elimination stage of the SA; and a load compensation circuit electrically connected to the amplifier circuit, and configured to compensate a difference between loads of the amplifier circuit in an amplification stage of the SA.

According to a third aspect of the disclosure, a method for controlling an SA is provided. The SA may include an amplifier circuit, an offset voltage storage circuit and a load compensation circuit; and the method for controlling the SA includes the following operations. In an offset elimination stage of the SA, an offset voltage of the amplifier circuit is controlled to be stored in the offset voltage storage circuit. In an amplification stage of the SA, a difference between loads of the amplifier circuit is compensated through the load compensation circuit.

It is to be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure. It is apparent that the accompanying drawings in the description below are merely some of the embodiments of the disclosure, based on which other drawings may be obtained by a person of ordinary skill in the art without any creative effort. In the drawings.

DETAILED DESCRIPTION

Figure 1:
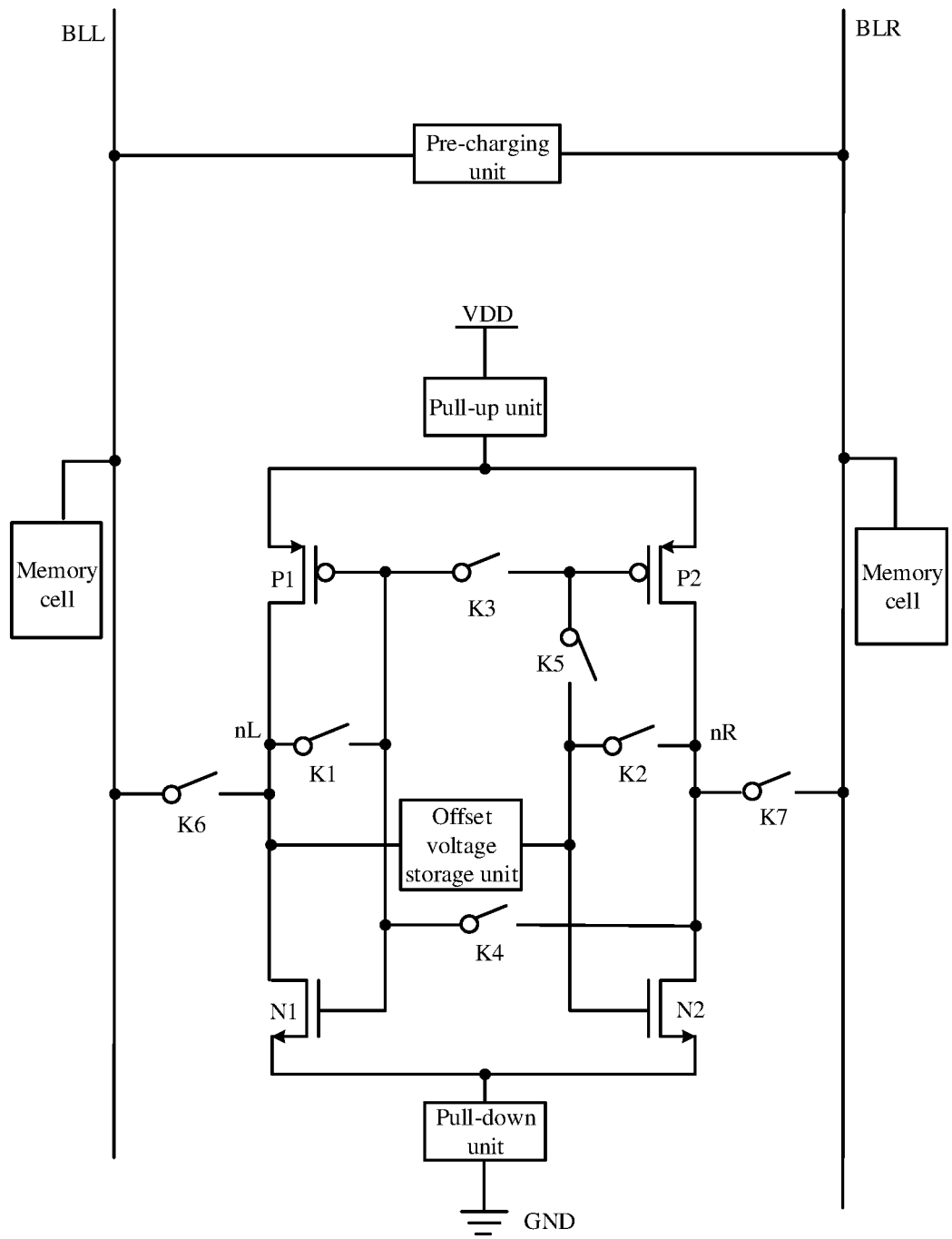
FIG. 1 schematically illustrates a circuit diagram of an SA according to an embodiment of the disclosure.

Exemplary embodiments will now be described more fully with reference to the accompanying drawings. However, the exemplary embodiments may be implemented in various forms and should not be understood as being limited to the examples set forth herein; rather, these embodiments are provided to make the disclosure more thorough and complete, and to fully convey the concepts of the example embodiments to those skilled in the art. The features, structures or characteristics described herein may be combined in one or more embodiments in any suitable manner. In the following description, numerous specific details are provided to offer a thorough understanding on the embodiments of the disclosure. However, those skilled in the art will appreciate that the technical solution of the disclosure may be practiced without one or more of the specific details, or that other methods, components, devices, steps, and the like may be employed. In other cases, well-known technical solutions will not be shown or described in detail to avoid obscuring aspects of the disclosure.

In addition, the drawings are merely schematic representations of the disclosure and are not necessarily drawn to scale. The same reference numerals in the drawings denote the same or similar parts, and repetitive description thereof will be omitted. The descriptions on "first", "second", "third", "fourth", "fifth", "sixth", "seventh" and "eighth" are merely for distinguishing from one another and should not be taken as limits to the disclosure.

It is to be noted that the terms "connection" in the disclosure may include a direct connection and an indirect connection. In the direct connection, no component is present between two ends. For example, a first end of a switch A is connected to a first end of a switch B, which may mean that only a connection wire (such as a metal wire) is present between the first end of the switch A and the first end of the switch B, while other components are not present. In the indirect connection, other components may be present between two ends. For example, a first end of a switch C is connected to a first end of a switch D, which may mean that at least one other component (such as a switch E), except for the connection wire, is further present on the connection line between the first end of the switch C and the first end of the switch D.

In addition, in the following description, it will be easily understood by those skilled in the art that terms "offset" and "misalignment" have the same meaning, and both represent a deviation due to a difference in transistors.

In the SA, due to the difference of a manufacture procedure and an influence of a working environment, transistors may be varying in size, migration rate, threshold voltage and the like. The transistors are typically impossible to be the same completely in performance, which will result in the misalignment of the SA, a misalignment noise appears, and a correctness of the memory to read data will be seriously affected.

For example, the SA includes two symmetrically configured N-channel Metal Oxide Semiconductor (NMOS) transistors; and in an ideal state, it is expected that the two NMOS transistors are completely the same in performance. However, as a matter of fact, threshold voltages of the two NMOS transistors may be different, which will cause the misalignment of the circuit. By this time, if no actions are taken, when the data is read from the memory, the original stored "1" may be read as "0" wrongly, or the originally stored "0" is read as "1" wrongly.

In view of this, the disclosure provides an SA.

FIG. 1 schematically illustrates a circuit diagram of an SA according to an embodiment of the disclosure. Referring to FIG. 1, an offset voltage storage unit is configured in the SA, and an offset voltage produced due to inconsistency between at least two components in the SA will be stored to the offset voltage storage unit in the offset elimination stage of the SA. Therefore, when data is read from the bit line, an offset compensation of the SA may be implemented by virtue of the offset voltage stored in the offset voltage storage unit, and the influence on a read operation due to a mismatch between the transistors is reduced to a great extent, thereby improving an accuracy of reading data, and optimizing the performance of the semiconductor memory.

In some embodiments of the circuit shown in FIG. 1, the offset voltage storage unit may be configured to include one capacitor. In this case, in the amplification stage of the SA, a capacitance on the bit line BLL includes own parasitic capacitance and a capacitance of the offset voltage storage unit, whereas a capacitance on the bit line BLR only includes own parasitic capacitance. The asymmetric of total capacitances on the bit lines may lead to inconsistent loads on the bit line BLL and the bit line BLR, and thus the read data may be wrong.

In view of this, the disclosure further provides a novel SA.

According to an embodiment, an SA is provided, which includes: an amplifier module, configured to read data of a memory cell on a first bit line or a second bit line; an offset voltage storage unit, electrically connected to the amplifier module, and configured to store an offset voltage of the amplifier module in an offset elimination stage of the SA; and a load compensation unit, electrically connected to the amplifier module, and configured to compensate a difference between loads of the amplifier module in an amplification stage of the SA.

Optionally, the difference between the loads of the amplifier module is produced by inconsistency between loads of the first bit line and the second bit line due to the offset voltage storage unit.

Optionally, the amplifier module may include: a first P-channel Metal Oxide Semiconductor (PMOS) transistor; a second PMOS transistor, a source of the second PMOS transistor being connected to a source of the first PMOS transistor; a first N-channel Metal Oxide Semiconductor (NMOS) transistor, a drain of the first NMOS transistor being connected to a drain of the first PMOS transistor and a first end of the offset voltage storage unit, and a gate of the first NMOS transistor being connected to a gate of the first PMOS transistor; and a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second end of the offset voltage storage unit. In the offset elimination stage of the SA, the first PMOS transistor and the second PMOS transistor are configured as a current mirror, and each of the first NMOS transistor and the second NMOS transistor is configured as a diode connection mode, to store the offset voltage of the amplifier module in the offset voltage storage unit.

Optionally, the drain of the first PMOS transistor and the drain of the first NMOS transistor are connected to a first node, and the drain of the second PMOS transistor and the drain of the second NMOS transistor are connected to a second node. The SA may further include: a first switch, a first end of the first switch being connected to the first node, and a second end of the first switch being connected to the gate of the first NMOS transistor; a second switch, a first end of the second switch being connected to the second node, and a second end of the second switch being connected to the gate of the second NMOS transistor; and a third switch, a first end of the third switch being connected to the gate of the first PMOS transistor, and a second end of the third switch being connected to the gate of the second PMOS transistor. In the offset elimination stage of the SA, the first switch, the second switch and the third switch are all in a closed state.

Optionally, the SA may further include: a pull-up unit, configured to control, in response to a pull-up control signal, a connected state of the source of the first PMOS transistor with a power voltage; and a pull-down unit, configured to control, in response to a pull-down control signal, whether the source of the first NMOS transistor is grounded. In the offset elimination stage of the SA, the source of the first PMOS transistor is connected to the power voltage, and the source of the first NMOS transistor is grounded.

Optionally, the SA may further include: a fourth switch, a first end of the fourth switch being connected to the gate of the first NMOS transistor, and a second end of the fourth switch being connected to the second node; and a fifth switch, a first end of the fifth switch being connected to the gate of the second PMOS transistor, and a second end of the fifth switch being connected to the gate of the second NMOS transistor. In the offset elimination stage of the SA, the fifth switch is open.

Optionally, the SA may further include: a sixth switch, a first end of the sixth switch being connected to the first bit line, and a second end of the sixth switch being connected to the first node; and a seventh switch, a first end of the seventh switch being connected to the second bit line, and a second end of the seventh switch being connected to the second node. In the offset elimination stage of the SA, both the sixth switch and the seventh switch are open.

Optionally, a first end of the load compensation unit is connected to the gate of the first NMOS transistor, and a second end of the load compensation unit is connected to the second node. In the offset elimination stage of the SA, the fourth switch is open, and the load compensation unit stores the offset voltage of the amplifier module.

Optionally, after the offset elimination stage of the SA, the fourth switch is closed, to eliminate the offset voltage of the amplifier module that is stored in the load compensation unit.

Optionally, in an induction stage of the SA, a memory cell corresponding to the first bit line or a memory cell corresponding to the second bit line is turned on, the first switch, the second switch and the third switch are open, the source of the first PMOS transistor is disconnected from the power voltage, the source of the first NMOS transistor is disconnected from the ground, the fourth switch is open, the fifth switch, the sixth switch and the seventh switch are closed, to input voltages on the first bit line and the second bit line to the SA.

Optionally, in the amplification stage of the SA, the source of the first PMOS transistor is connected to the power voltage, and the source of the first NMOS transistor is grounded, to amplify the voltages on the first bit line and the second bit line.

Optionally, the SA may further include: an eighth switch, a first end of the eighth switch being connected to the first node, and a second end of the eighth switch being connected to the gate of the second NMOS transistor. In the offset elimination stage, the induction stage and a first amplification process of the amplification stage of the SA, the eighth switch is open. In a second amplification process of the amplification stage of the SA, the fourth switch and the eighth switch are closed.

Optionally, the SA may further include: a pre-charging unit, configured to pre-charge the first bit line and the second bit line when the SA is in a pre-charging stage.

Optionally, the pre-charging stage and the offset elimination stage are configured to be executed at the same time.

According to an embodiment, a memory is provided, which includes any of the above SAs.

According to an embodiment, a method for controlling an SA is provided. The SA may include an amplifier module, an offset voltage storage unit and a load compensation unit; and the method for controlling the SA includes the following operations. In an offset elimination stage of the SA, an offset voltage of the amplifier module is controlled to be stored in the offset voltage storage unit. In an amplification stage of the SA, a difference between loads of the amplifier module is compensated through the load compensation unit.

Optionally, in the offset elimination stage of the SA, the load compensation unit stores the offset voltage of the amplifier module; and the method for controlling the SA may further include the following operations. After the offset elimination stage of the SA, the offset voltage of the amplifier module that is stored in the load compensation unit is eliminated. In a first amplification process of the amplification stage of the SA, voltages on a first bit line and a second bit line are amplified. In a second amplification process of the amplification stage of the SA, the offset voltage storage unit and the load compensation unit are controlled to be shorted.

Optionally, the method for controlling the SA may further include the following operation. In the amplification stage of the SA, based on the offset voltage stored in the offset voltage storage unit, the voltages on the first bit line and the second bit line are inhibited from being wrongly amplified due to inconsistency of at least two transistors in the amplifier module. The transistors in the amplifier module may at least include a first NMOS transistor, a second NMOS transistor, a first PMOS transistor and a second PMOS transistor.

Optionally, a working stage of the SA may further include a pre-charging stage; and the method for controlling the SA may further include the following operation. In the pre-charging stage of the SA, the first bit line and the second bit line are pre-charged.

Optionally, the method for controlling the SA may further include the following operation. When the SA is in the offset elimination stage, a pre-charging operation in the pre-charging stage is controlled to be executed.

Figure 2:
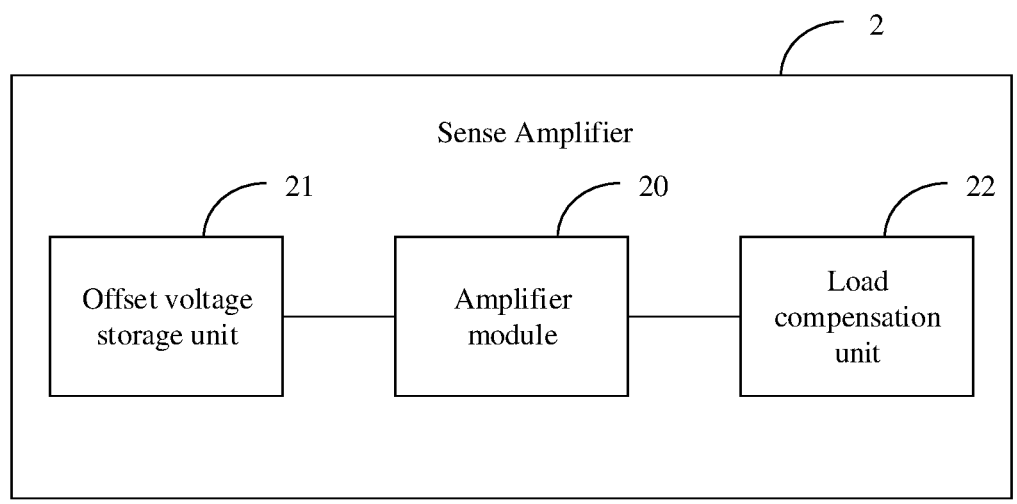
FIG. 2 schematically illustrates a block diagram of an SA according to an exemplary embodiment of the disclosure.

FIG. 2 schematically illustrates a block diagram of an SA according to an exemplary embodiment of the disclosure. As shown in FIG. 2, the SA 2 may include an amplifier module 20, an offset voltage storage unit 21 and a load compensation unit 22.

The amplifier module 20 is configured to read data from a memory cell on a first bit line or a second bit line.

The offset voltage storage unit 21 is electrically connected to the amplifier module 20, and configured to store an offset voltage of the amplifier module 20 in an offset elimination stage of the SA 2.

The load compensation unit 22 is electrically connected to the amplifier module 20, and configured to compensate a difference between loads of the amplifier module 20 in an amplification stage of the SA.

It is to be noted that the offset voltage of the amplifier module 20 may refer to an offset voltage between components included in the amplifier module 20. That is, the offset voltage of the amplifier module 20 may represent a voltage difference produced by inconsistency between at least two components in the amplifier module 20. In a case of integrating voltage differences between all components, the offset voltage refers to an offset voltage of the whole amplifier module 20.

The amplifier module 20 may include a first PMOS transistor (hereinafter referred to as the transistor P1), a second PMOS transistor (hereinafter referred to as the transistor P2), a first NMOS transistor (hereinafter referred to as the transistor N1), and a second NMOS transistor (hereinafter referred to as the transistor N2).

In some embodiments of the disclosure, the offset voltage storage unit 21 may be configured as a capacitor. However, any device and unit having a voltage storage function may serve as the offset voltage storage unit in the disclosure, and the configuration form of the offset voltage storage unit is not limited in the disclosure.

In addition, the load compensation unit 22 may also be configured as a capacitor with the same capacitance as that of the offset voltage storage unit 21. In this case, by configuring the load compensation unit, bit line capacitance loads of the first bit line and the second bit line may be symmetric.

However, when the offset voltage storage unit 21 is configured in a form other than the capacitor, the load compensation unit 22 may be configured in a same circuit form as that of the offset voltage storage unit 21.

It is to be noted that, in some embodiments of the disclosure, the amplifier module 20 is connected to the first bit line and the second bit line, the first bit line corresponds to one load, and the second bit line corresponds to the other load. The difference between the loads of the amplifier module 20 herein refers to a difference between the load corresponding to the first bit line and the load corresponding to the second bit line. It is to be understood that such a difference is produced by the offset voltage storage unit 21. That is, because the offset voltage storage unit 21 is introduced to the SA 2, the load on the first bit line and the load on the second bit line are inconsistent.

However, in other embodiments of the disclosure, the difference between the loads of the amplifier module 20 may further be attributed to other asymmetric factors in the circuit. For example, two phase inverters included in the amplifier module 20 are inconsistent due to the difference in the transistors. The reason for the difference between the loads of the amplifier module 20 is not limited by the disclosure.

That is, even though the amplifier module 20 is disconnected from the first bit line and the second bit line in the amplification stage, the circuit solution of the disclosure may also be used to implement the load compensation.

Figure 3:
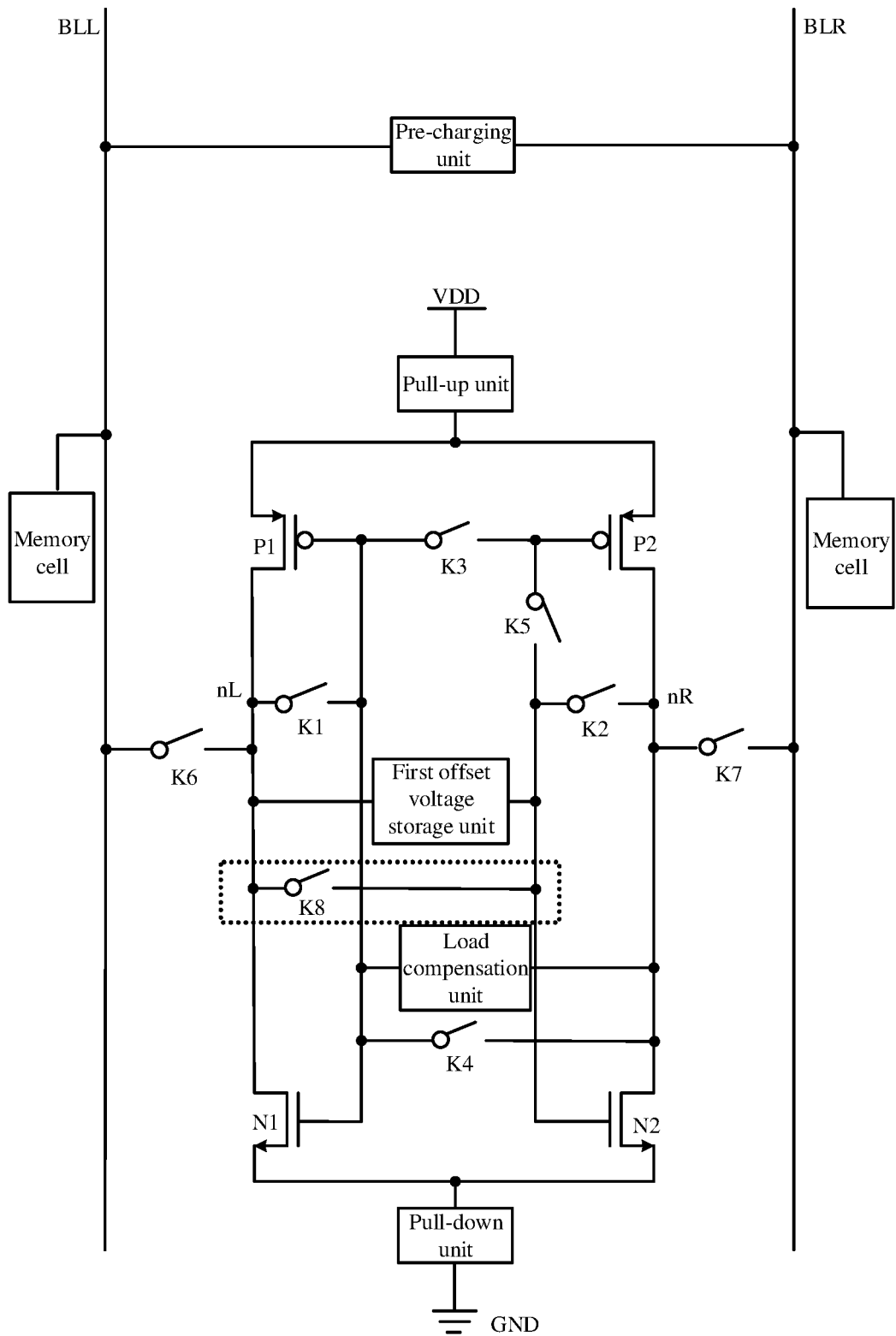
FIG. 3 schematically illustrates a circuit diagram of an SA according to an exemplary embodiment of the disclosure.

FIG. 3 schematically illustrates a circuit diagram of an SA according to an exemplary embodiment of the disclosure.

Referring to FIG. 3, a source of the transistor P1 is connected to a source of the transistor P2, a drain of the transistor P1 is connected to a drain of the transistor N1, and a gate of the transistor P1 is connected to a gate of the transistor N1. For the ease of subsequent description, a first node nL may be defined in the SA, and the drain of the transistor P1 and the drain of the transistor N1 are connected to the first node nL.

A drain of the transistor N2 is connected to a drain of the transistor P2, and a source of the transistor N2 is connected to a source of the transistor N1. For the ease of subsequent description, a second node nR may be defined in the SA, and the drain of the transistor N2 and the drain of the transistor P2 are connected to the second node nR.

A first end of the offset voltage storage unit is connected to the drain of the transistor N1, i.e., to the first node nL. A second end of the offset voltage storage unit is connected to a gate of the transistor N2.

A working stage of the SA in the exemplary embodiment of the disclosure may be divided into: an offset elimination stage, an induction stage and an amplification stage.

In the offset elimination stage, the SA may store an offset voltage between at least two transistors among the transistor N1, the transistor N2, the transistor P1 and the transistor P2 in the offset voltage storage unit. The offset voltage is produced due to differences in size, migration rate, threshold voltage and the like of the transistors. In the amplification stage, the SA may inhibit the influence of performance misalignment of the transistors on data amplification according to the offset voltage stored in the offset voltage storage unit, such that the data on the bit line may be accurately read.

For the offset elimination stage of the SA, the transistor P1 and the transistor P2 may be configured as a current mirror, and each of the transistor N1 and the transistor N2 may be configured as a diode connection mode, to store the offset voltage of the amplifier module in the offset voltage storage unit.

It is to be noted that the offset voltage of the amplifier module refers to an offset voltage between at least two transistors (or components) in the amplifier module. Specifically, it may be an offset voltage between the transistor P1 and the transistor P2, may also be an offset voltage between the transistor N1 and the transistor N2, and may further be an offset voltage obtained by integrating the above two cases, which is not limited by the disclosure.

Referring to FIG. 3, the SA may further include a first switch (hereinafter referred to as the switch K1), a second switch (hereinafter referred to as the switch K2), and a third switch (hereinafter referred to as the switch K3), to implement configuration of the transistors N1, N2, P1 and P2 in the offset elimination stage of the SA.

A first end of the switch K1 is connected to the first node nL, and a second end of the switch K1 is connected to the gate of the transistor N1. A first end of the switch K2 is connected to the second node nR, and a second end of the switch K2 is connected to the gate of the transistor N2. A first end of the switch K3 is connected to the gate of the transistor P1, and a second end of the switch K3 is connected to the gate of the transistor P2.

In the offset elimination stage of the SA, the switch K1, the switch K2 and the switch K3 are all in a closed state.

Types of the switch K1, the switch K2 and the switch K3 are not limited by the disclosure. For example, the switch K1 may be a PMOS transistor, NMOS transistor or Complementary Metal-Oxide-Semiconductor (CMOS) transmission gate; the switch K2 may be a PMOS transistor, NMOS transistor or CMOS transmission gate; and the switch K3 may be a PMOS transistor, NMOS transistor or CMOS transmission gate.

In some embodiments of the disclosure, the switch K1 may include a control end, configured to control an on-off state of the switch K1 in response to a first control signal; the switch K2 may also include a control end, configured to control an on-off state of the switch K2 in response to a second control signal; and the switch K3 may also include a control end, configured to control an on-off state of the switch K3 in response to the second control signal. That is, the control end of each of the switch K2 and the switch K3 may receive the second control signal.

The SA in the exemplary embodiment of the disclosure may further include a pull-up unit and a pull-down unit. The pull-up unit is configured to connect the source of the transistor P1 to a power voltage VDD in response to a pull-up control signal. The pull-down unit is configured to ground the source of the transistor N1 in response to a pull-down control signal.

In an embodiment of the disclosure, the pull-up unit may include a pull-up PMOS transistor, and the pull-down unit may include a pull-down NMOS transistor. However, the pull-up unit may also be implemented with the NMOS transistor, and the pull-down unit may also be implemented with the PMOS transistor. The pull-up unit or the pull-down unit may include more than one device, and may also include multiple devices that are controlled to be turned on or off through different control signals, which is not limited by the disclosure.

With continuing reference to FIG. 3, the SA in the disclosure may further include a fourth switch (hereinafter referred to as the switch K4) and a fifth switch (hereinafter referred to as the switch K5).

A first end of the switch K4 is connected to the gate of the transistor N1, and a second end of the switch K4 is connected to the second node nR. A first end of the switch K5 is connected to the gate of the transistor P2, and a second end of the switch K5 is connected to the gate of the transistor N2.

Similarly, types of the switch K4 and the switch K5 are not limited by the disclosure. For example, the switch K4 may be a PMOS transistor, NMOS transistor or CMOS transmission gate; and the switch K5 may be a PMOS transistor, NMOS transistor or CMOS transmission gate.

In some embodiments of the disclosure, the switch K4 may include a control end, configured to control an on-off state of the switch K4 in response to a third control signal; and the switch K5 may also include a control end, configured to control an on-off state of the switch K5 in response to a fourth control signal.

In the offset elimination stage of the SA, both the switch K4 and the switch K5 may be in an open state.

In addition, the SA in the disclosure may further include a sixth switch (hereinafter referred to as the switch K6) and a seventh switch (hereinafter referred to as the switch K7).

A first end of the switch K6 is connected to the first bit line (denoted as the BLL), and a second end of the switch K6 is connected to the first node nL. A first end of the switch K7 is connected to the second bit line (denoted as the BLR), and a second end of the switch K7 is connected to the second node nR. It will be easily understood by those skilled in the art that each of the first bit line BLL and the second bit line BLR corresponds to a respective memory cell.

Similarly, types of the switch K6 and the switch K7 are not limited by the disclosure. For example, the switch K6 may be a PMOS transistor, NMOS transistor or CMOS transmission gate; and the switch K7 may be a PMOS transistor, NMOS transistor or CMOS transmission gate.

In some embodiments of the disclosure, the switch K6 may include a control end, configured to control an on-off state of the switch K6 in response to a fifth control signal; and the switch K7 may also include a control end, configured to control an on-off state of the switch K7 in response to the fifth control signal. That is, the control end of each of the switch K6 and the switch K7 may receive the fifth control signal.

In the offset elimination stage of the SA, both the switch K6 and the switch K7 are in an open state.

In combination with the above exemplary circuit configuration, in the offset elimination stage of the SA, the offset voltage of the amplifier module may be stored in the offset voltage storage unit.

With continuing reference to FIG. 3, a first end of the load compensation unit is connected to the gate of the transistor N1, and a second end of the load compensation unit is connected to the second node nR.

In the offset elimination stage of the SA, in the example where the switch K4 is in the open state, the load compensation unit may also store the offset voltage of the amplifier module. In this case, after the offset elimination stage, the switch K4 may be closed to eliminate the offset voltage stored by the load compensation unit.

In the induction stage after the offset elimination stage of the SA, the memory cell corresponding to the first bit line BLL or the memory cell corresponding to the second bit line BLR is turned on, the switch K1 is opened, the switch K2 and the switch K3 are opened, the source of the transistor P1 and the source of the transistor P2 are disconnected from the power voltage, the source of the transistor N1 and the source of the transistor N2 are disconnected from the ground, the switch K4 is opened, the switch K5 is closed, and the switch K6 and the switch K7 are closed, to input the voltages of the first bit line BLL and the second bit line BLR to the SA. As the offset voltage between the transistor N1 and the transistor N2 is stored in the offset voltage storage unit, a data reading error produced by inconsistency between the transistor N1 and the transistor N2 may be inhibited.

It is to be understood by those skilled in the art that the operation that the memory cell is turned on refers to that a word line of the memory cell is activated, such that data (0 or 1) stored in the memory cell is transmitted to the bit line.

When the voltage difference between the first bit line BLL and the second bit line BLR is input to the SA, the source of the transistor P1 is connected to the power voltage, and the source of the transistor N1 is grounded, to amplify the voltages on the first bit line BLL and the second bit line BLR.

In the amplification stage, because of the symmetric structure of the offset voltage storage unit and the load compensation unit, the total capacitance on the first bit line BLL is the same as the capacitance load on the second bit line BLR. In this case, the data will not be wrongly amplified due to inconsistency between loads on two sides of the SA, and an accuracy of reading data may be greatly improved.

In addition, referring to FIG. 3, in some embodiments of the disclosure, the SA may further include an eighth switch (hereinafter referred to as the switch K8).

A first end of the switch K8 is connected to the first node nL, and a second end of the switch K8 is connected to the gate of the transistor N2.

In this case, the amplification stage of the SA may include a first amplification process and a second amplification process. Specifically, the switch between the first amplification process and the second amplification process may be implemented in combination with the switch K8.

In the offset elimination stage, the induction stage and the first amplification process of the amplification stage of the SA, the switch K8 is opened. In the second amplification process of the amplification stage of the SA, that is, after the difference between the voltages on the first bit line BLL and the second bit line BLR is enlarged, the switch K4 and the switch K8 may be closed.

In the case where the switch K4 and the switch K8 are closed, both the offset voltage storage unit and the load compensation unit are in a shorted state, so as to eliminate the influence of the offset voltage storage unit and the load compensation unit on a circuit speed of the SA.

In addition, still referring to FIG. 3, the SA in the exemplary embodiment of the disclosure may further include a pre-charging unit. The pre-charging unit is configured to pre-charge the first bit line BLL and the second bit line BLR when the SA is in a pre-charging stage.

As can be seen, for the SA structure in the exemplary embodiment of the disclosure, as both the switch K6 and the switch K7 are in the open state in the offset elimination stage, while the first bit line BLL and the second bit line BLR are pre-charged, the operation of storing the offset voltage between the transistor N1 and the transistor N2 to the offset voltage storage unit is not affected. Therefore, in the exemplary embodiment of the disclosure, the pre-charging stage and the offset elimination stage may be configured to be executed at the same time.

Figure 4:
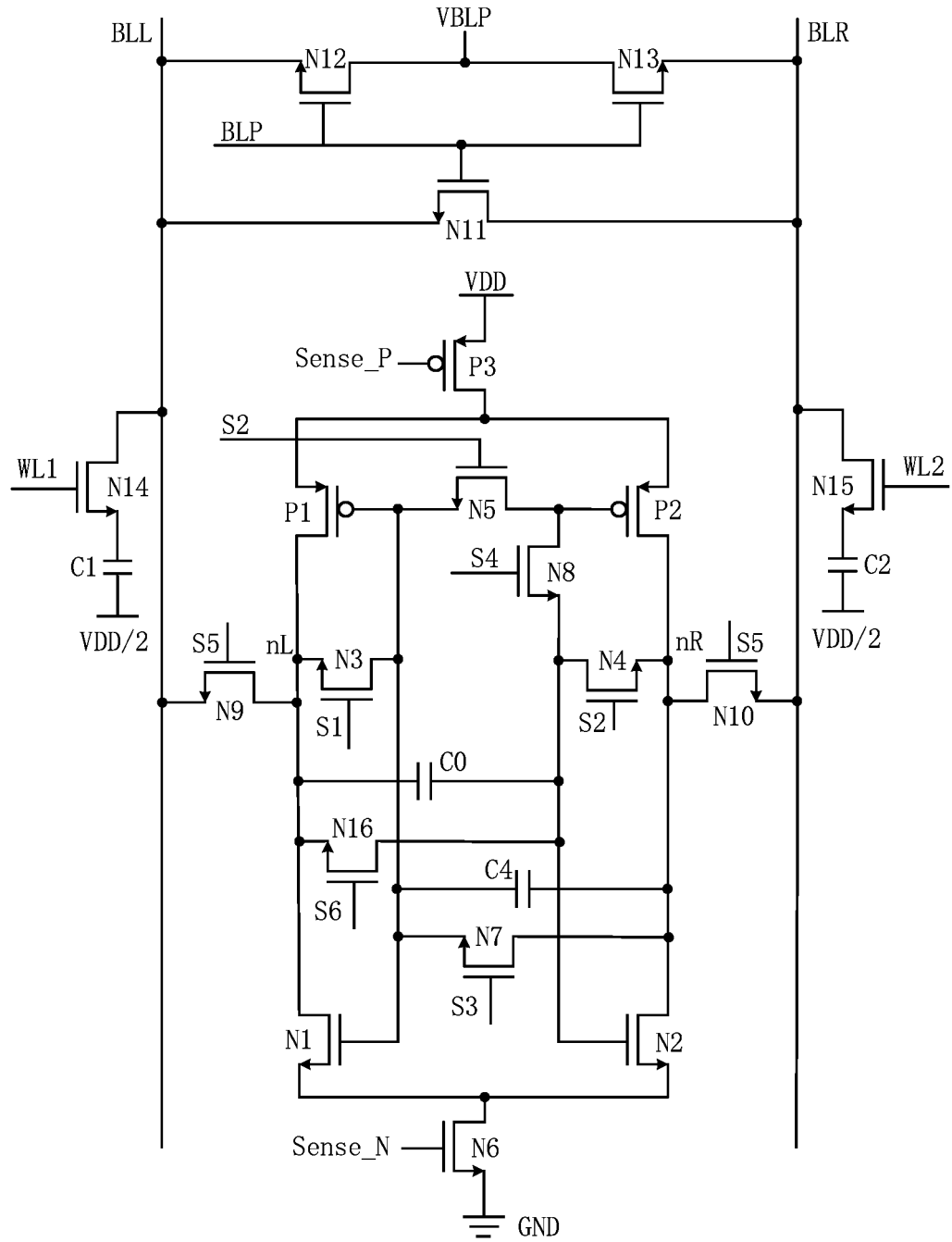
FIG. 4 schematically illustrates a circuit diagram of a specific configuration mode of an SA according to an embodiment of the disclosure.

FIG. 4 schematically illustrates a circuit diagram of an SA according to an embodiment of the disclosure.

In the embodiment shown in FIG. 4, the offset voltage storage unit is configured as a capacitor C0, and the load compensation unit is configured as a capacitor C4.

The switch K1 is configured as a transistor N3, which controls an on-off state in response to a first control signal S1. The switch K2 is configured as a transistor N4, which controls an on-off state in response to a second control signal S2. The switch K3 is configured as a transistor N5, which controls an on-off state in response to the second control signal S2.

The pull-up unit is configured as a transistor P3, which controls an on-off state in response to a pull-up control signal Sense_P; and the pull-down unit is configured as a transistor N6, which controls an on-off state in response to a pull-down control signal Sense_N.

The switch K4 is configured as a transistor N7, which controls an on-off state in response to a third control signal S3; and the switch K5 is configured as a transistor N8, which controls an on-off state in response to a fourth control signal S4.

The switch K6 is configured as a transistor N9, which controls an on-off state in response to a fifth control signal S5; and the switch K7 is configured as a transistor N10, which controls an on-off state in response to the fifth control signal S5.

The pre-charging unit may include a transistor N11, a transistor N12 and a transistor N13. A gate of each of the transistor N11, the transistor N12 and the transistor N13 may receive a pre-charging control signal BLP. A source of the transistor N11 is connected to the first bit line BLL, and a drain of the transistor N11 is connected to the second bit line BLR. A source of the transistor N12 is connected to the first bit line BLL, and a drain of the transistor N12 is connected to a pre-charging voltage VBLP. The pre-charging voltage VBLP is configured to be VDD/2. A source of the transistor N13 is connected to the second bit line BLR, and a drain of the transistor N13 is connected to the pre-charging voltage VBLP.

The memory cell corresponding to the first bit line BLL is configured to include a transistor N14 and a capacitor C1, and the transistor N14 controls an on-off state in response to a first word line control signal WL1. The memory cell corresponding to the second bit line BLR is configured to include a transistor N15 and a capacitor C2, and the transistor N15 controls an on-off state in response to a second word line control signal WL2.

The switch K8 is configured as a transistor N16, which controls an on-off state in response to a sixth control signal S6.

Figure 5:
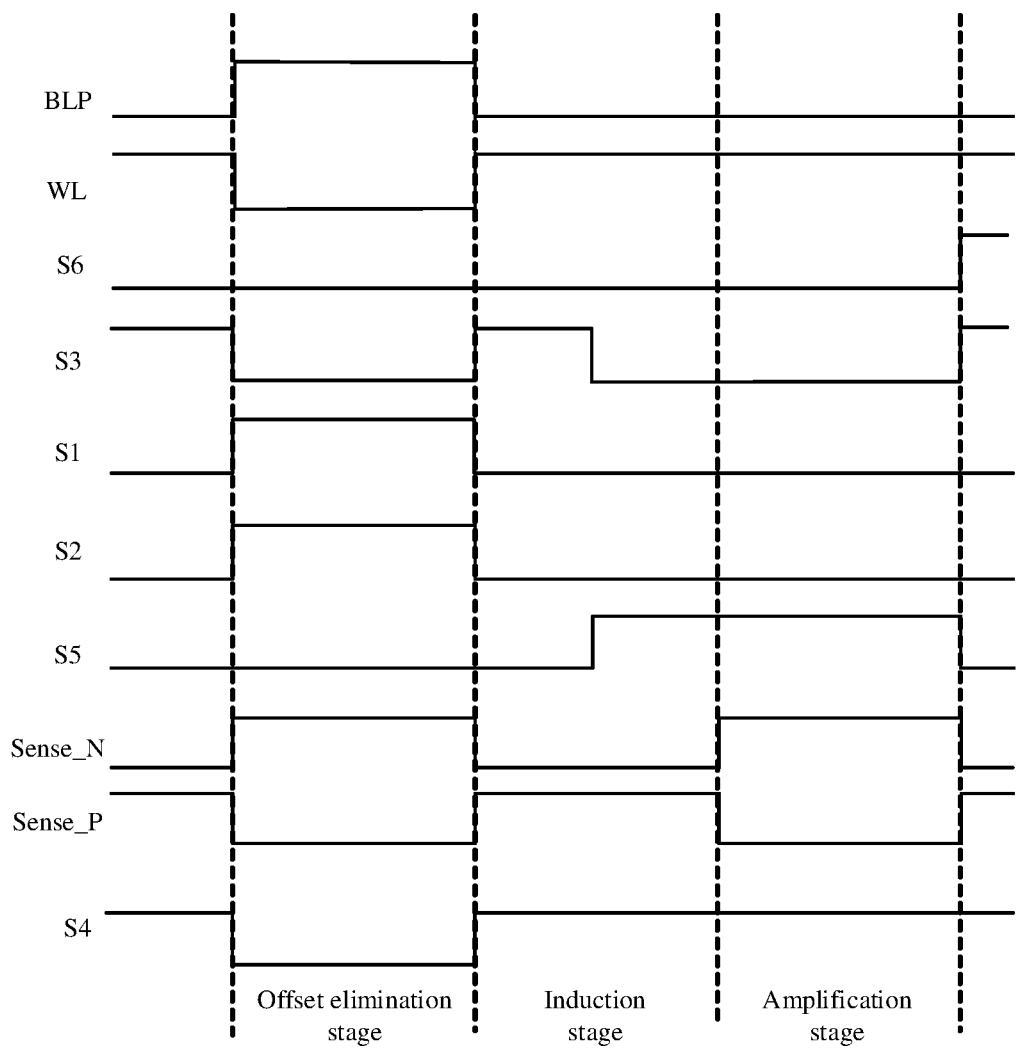
FIG. 5 schematically illustrates a sequence diagram of each control signal involved in an SA according to an embodiment of the disclosure.

FIG. 5 schematically illustrates a sequence diagram of each control signal according to an embodiment of the disclosure.

The working stages of the SA in some embodiments of the disclosure will be described in combination with the sequence diagram shown in FIG. 5 and with respective reference to FIG. 6, FIG. 7 and FIG. 8.

Figure 6:
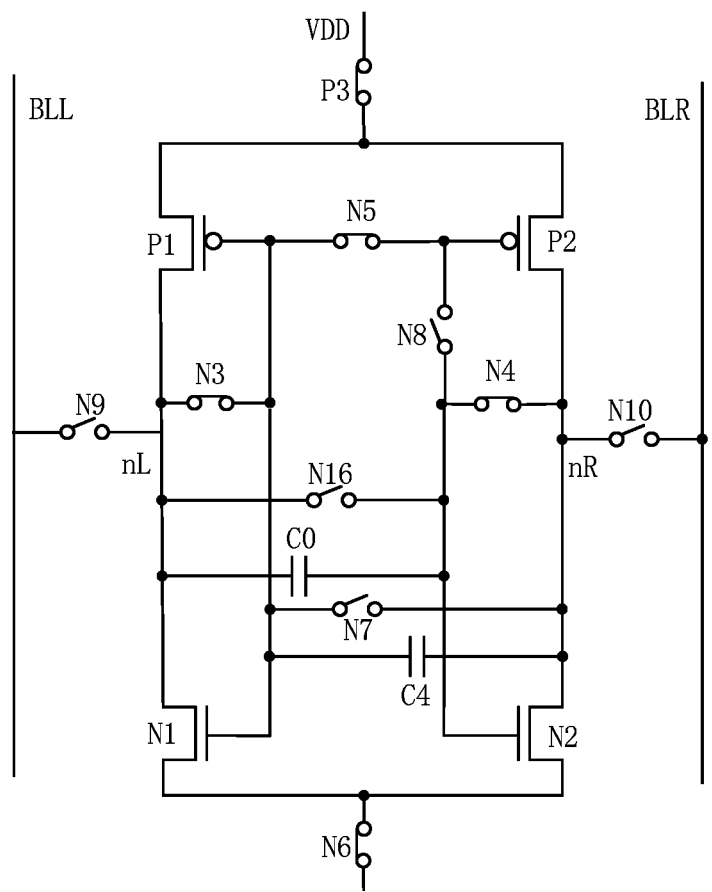
FIG. 6 schematically illustrates a circuit diagram of an SA in an offset elimination stage according to an embodiment of the disclosure.

FIG. 6 is directed to the offset elimination stage of the SA. The first control signal S1 is at a high level, and the transistor N3 is turned on (corresponding to the closed state of the switch). The second control signal S2 is at a high level, and the transistor N4 and the transistor N5 are turned on. The third control signal S3 is at a low level, and the transistor N7 is turned off (corresponding to the open state of the switch). The fourth control signal S4 is at a low level, and the transistor N8 is turned off. The fifth control signal S5 is at a low level, and the transistor N9 and the transistor N10 are turned off. The sixth control signal S6 is at a low level, and the transistor N16 is turned off.

The pull-up control signal Sense_P is at a low level, and the transistor P3 is turned on. The pull-down control signal Sense_N is at a high level, and the transistor N6 is turned on.

Therefore, the transistor P1 and the transistor P2 are configured as a current mirror, and each of the transistor N1 and the transistor N2 is configured as a diode connection mode. In this case, the offset voltage between the transistor N1 and the transistor N2 is stored on the capacitor C0. The voltage at a side of the capacitor C0 close to the first bit line BLL may be denoted as VL, and the voltage at a side close to the second bit line BLR may be denoted as VR.

As can be seen, the offset voltage between the transistor N1 and the transistor N2 is also stored on the capacitor C4.

In addition, in the offset elimination stage, the word line WL1/WL2 is at a low level, and the corresponding transistor is in the disconnected state. That is, there is no data to be read on the bit line.

The pre-charging control signal BLP is at a high level, that is, the pre-charging is executed, and the first bit line BLL and the second bit line BLR are pre-charged to the pre-charging voltage VBLP.

Figure 7:
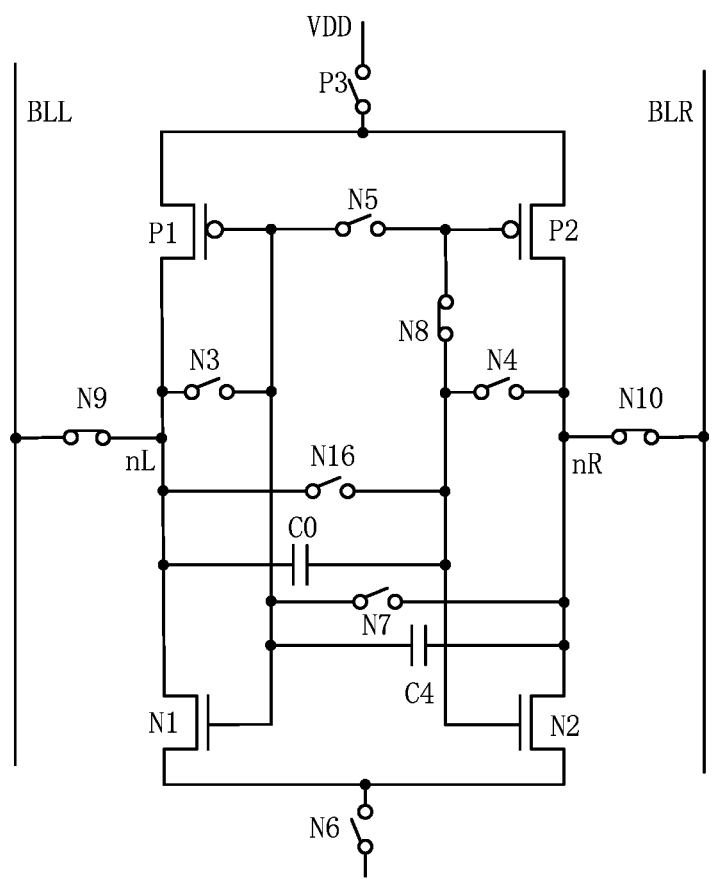
FIG. 7 schematically illustrates a circuit diagram of an SA in an induction stage according to an embodiment of the disclosure.

FIG. 7 is directed to the induction stage of the SA. The first control signal S1 is at a low level, and the transistor N3 is turned off. The second control signal S2 is at a low level, and the transistor N4 and the transistor N5 are turned off. The third control signal S3 is at a high level first, such that the transistor N7 is turned on, and the capacitor C4 discharges, to eliminate the stored offset voltage. Then, the third control signal S3 becomes to a low level, and the transistor N7 is turned off. The fourth control signal S4 is at a high level, and the transistor N8 is turned on. The fifth control signal S5 is continuously at a low level and then turns to a high level, the transistor N9 and the transistor N10 are in the disconnected state first and then are turned on.

The pull-up control signal Sense_P is at a high level, and the transistor P3 is turned off. The pull-down control signal Sense_N is at a low level, and the transistor N6 is turned off.

In addition, the pre-charging control signal BLP is at a low level, and the pre-charging is ended.

First of all, the word line WL is at a high level, the corresponding transistor is turned on, and the data stored in the capacitor is transmitted to the bit line. For example, the first word line control signal WL1 is at the high level, the transistor N14 is turned on, and the data stored on the capacitor C1 is transmitted to the first bit line BLL. Due to the influence of the data on the bit line, a relatively small voltage difference is formed between the first bit line BLL and the second bit line BLR.

Next, the fifth control signal S5 turns to the high level, and the transistor N9 and the transistor N10 are turned on, such that the relatively small voltage difference is transmitted to the inside of the SA. Due to the capacitor C0, the voltage actually transmitted to the gate of the transistor N2 is VBLL+VR−VL, where the VBLL is the voltage on the first bit line. Therefore, the voltage difference due to inconsistency between the transistor N1 and the transistor N2 is inhibited from being wrongly amplified, to reduce the read error rate.

Figure 8:
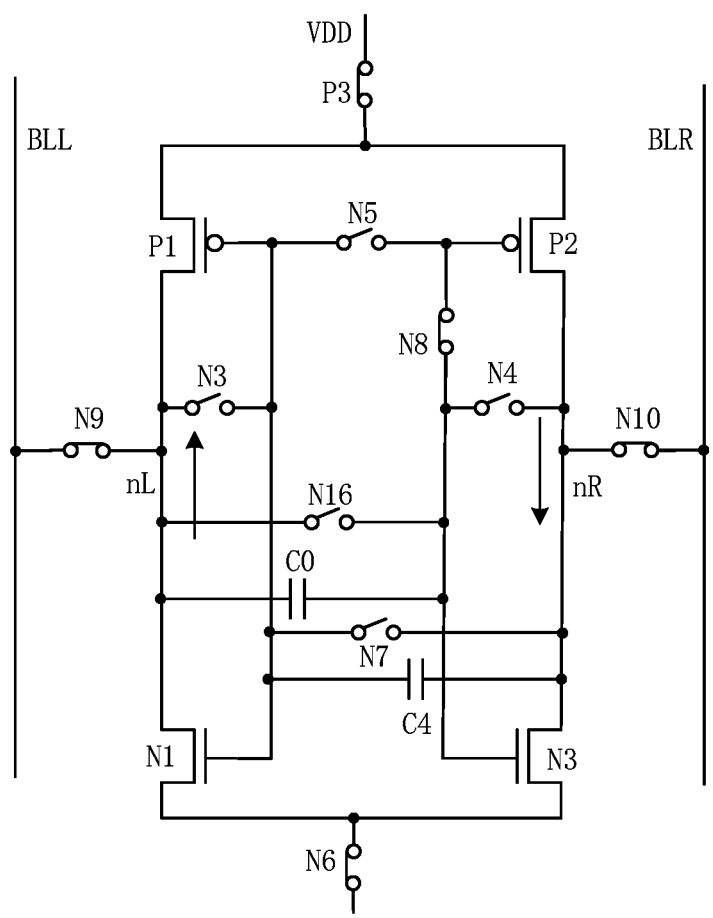
FIG. 8 schematically illustrates a circuit diagram of an SA in an amplification stage according to an embodiment of the disclosure.

FIG. 8 is directed to the amplification stage of the SA. Referring to the sequence diagram of FIG. 5, compared with the induction stage, the pull-up control signal Sense_P is at the low level, and the transistor P3 is turned on; and the pull-down control signal Sense_N is at the high level, and the transistor N6 is turned on.

In this case, the transistor P1, the transistor P2, the transistor N1 and the transistor N2 constitute a positive feedback circuit formed by two cross-coupling phase inverters, such that the voltage difference on the bit lines may be quickly amplified, and written back into the corresponding memory cell.

It is to be noted that, by configuring the C4 to form the symmetric structure with the C0, the load difference on the first bit line BLL and the second bit line BLR is compensated, thereby further improving the accuracy of reading data.

In view of the C0 and the C4 in the circuit, the circuit speed may be reduced. In some embodiments of the disclosure, the problem is solved by dividing the amplification stage into the first amplification process and the second amplification process, and configuring the transistor N16. Specifically, in the offset elimination stage, the induction stage and the first amplification process of the amplification stage of the SA, the transistor N16 is in the disconnected state. In the second amplification process of the amplification stage, the transistor N16 and the transistor N7 are controlled to be turned on, such that the capacitor C0 and the capacitor C4 are in the shorted state, to improve the circuit speed.

In addition, in some embodiments of the disclosure, there may be a balance stage between the offset elimination stage and the induction stage of the SA, which makes the voltage at the first node nL consistent with the voltage at the second node nR.

Figure 9:
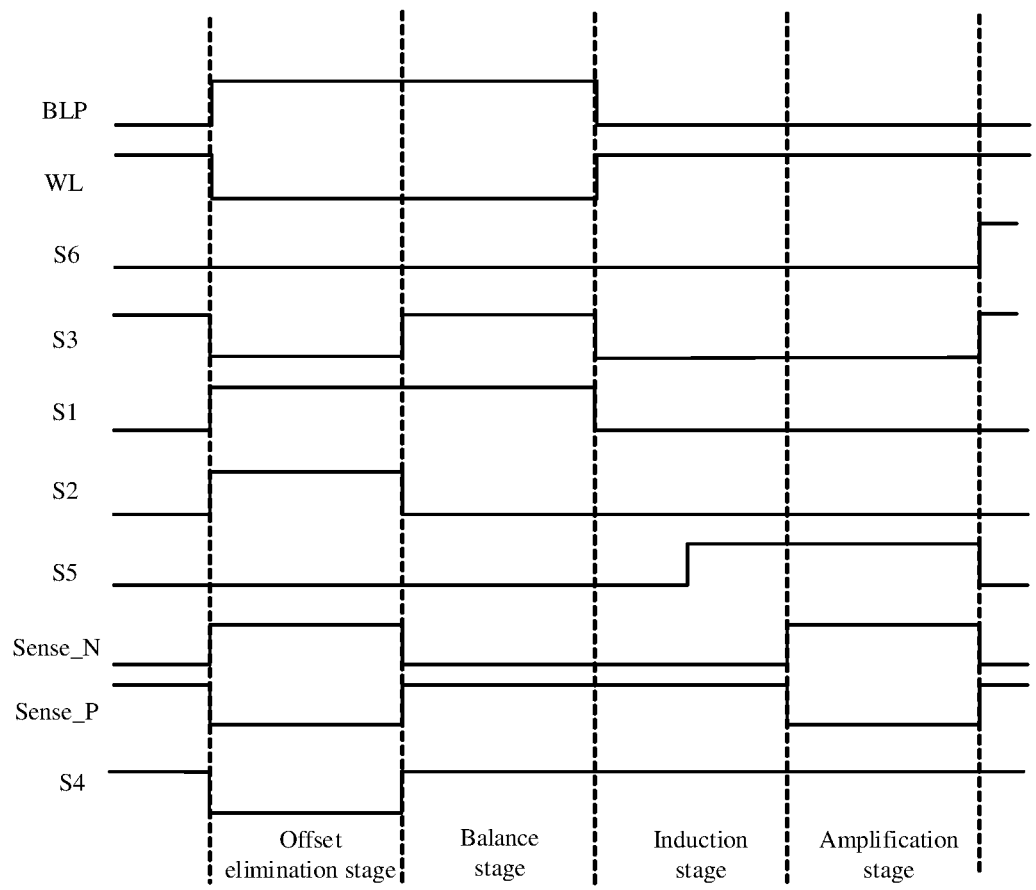
FIG. 9 schematically illustrates a sequence diagram of each control signal involved in an SA according to another embodiment of the disclosure.

FIG. 9 illustrates a sequence diagram of each control signal when a balance stage is included.

Figure 10:
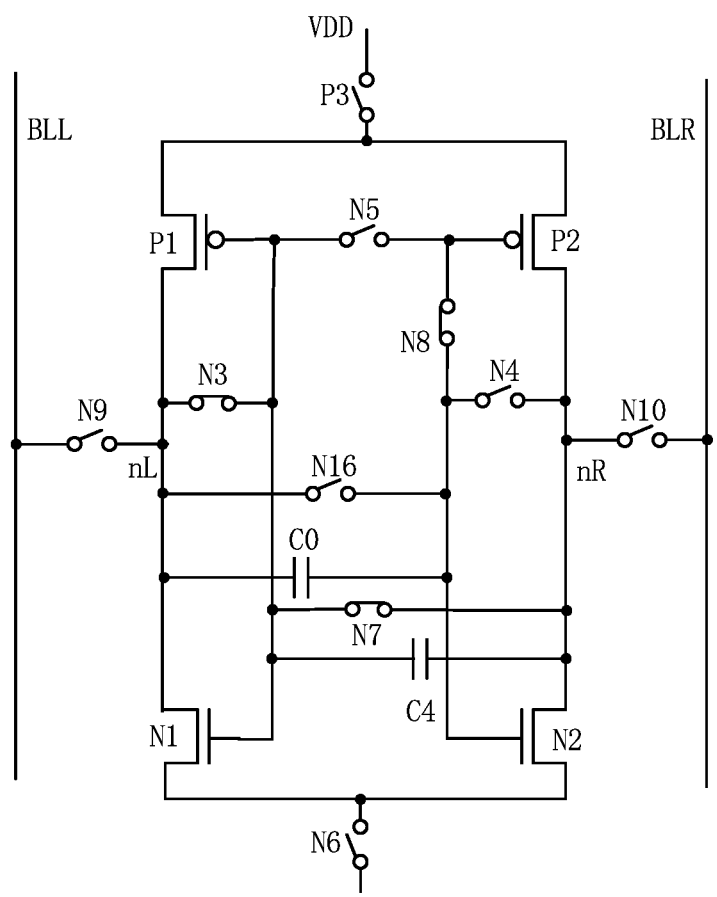
FIG. 10 schematically illustrates a circuit diagram of an SA in a balance stage according to an embodiment of the disclosure.

The balance stage in some embodiments of the disclosure will be described in combination with the sequence diagram shown in FIG. 9 and with reference to FIG. 10.

Compared with the offset elimination stage, in the balance stage of the SA, the second control signal S2 is at the low level, and the transistor N4 and the transistor N5 are turned off; the third control signal S3 is at the high level, and the transistor N7 is turned on; and the fourth control signal S4 is at the high level, and the transistor N8 is turned on.

The pull-up control signal Sense_P is at the high level, and the transistor P3 is turned off; and the pull-down control signal Sense_N is at the low level, and the transistor N6 is turned off.

Therefore, the voltage at the first node nL is consistent with the voltage at the second node nR in the SA, thereby achieving charge balance, and eliminating the influence on data reading due to the voltage difference formed in the offset elimination stage.

In the embodiment including the balance stage, the pre-charging stage may be executed when the offset elimination stage is executed, or the pre-charging stage may be executed when the balance stage is executed.

Further, the disclosure further provides a method for controlling an SA.

Figure 11:
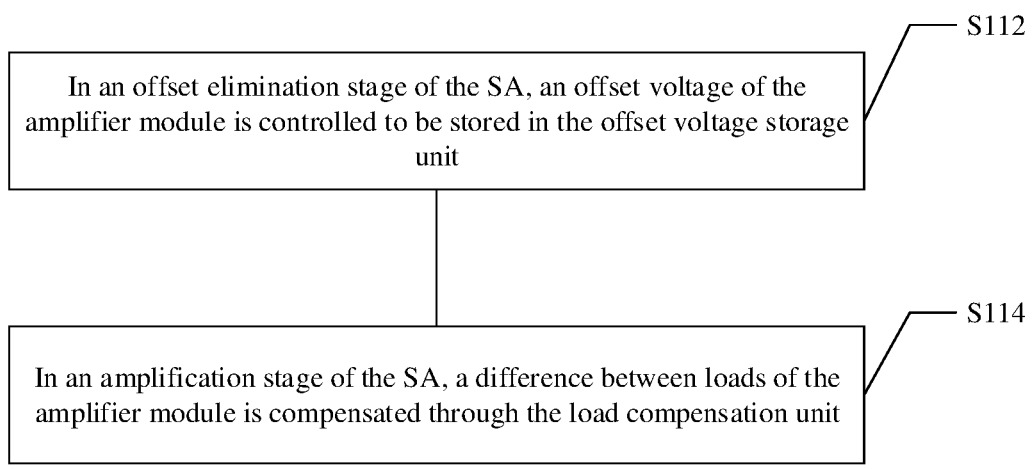
FIG. 11 schematically illustrates a flowchart of a method for controlling an SA according to an exemplary embodiment of the disclosure.

FIG. 11 schematically illustrates a flowchart of a method for controlling an SA according to an exemplary embodiment of the disclosure. As previously mentioned, the SA may include an amplifier module, an offset voltage storage unit and a load compensation unit.

Referring to FIG. 11, the method for controlling the SA may include the following operations.

In S112, in an offset elimination stage of the SA, an offset voltage of the amplifier module is controlled to be stored in the offset voltage storage unit.

In S114, in an amplification stage of the SA, a difference between loads of the amplifier module is compensated through the load compensation unit.

With the method for controlling the SA in the exemplary embodiment of the disclosure, on one hand, offset compensation of the SA may be implemented by virtue of the offset voltage stored in the offset voltage storage unit, and the influence of the misalignment voltage caused by mismatch of the transistors on reading the data of the bit line is reduced to a great extent, thereby improving the performance of the semiconductor memory; and on the other hand, by configuring the load compensation unit, it may be ensured that in the amplification stage of the SA, an adverse effect on a load of the SA due to introduction of the offset voltage storage unit is prevented, and the problem of reading the data in error due to the inconsistency of loads on the first bit line and the second bit line is prevented, thereby improving the accuracy of the reading, and further improving the performance of the semiconductor memory.

According to the exemplary embodiment of the disclosure, in the offset elimination stage of the SA, the load compensation unit stores the offset voltage of the amplifier module; and the method for controlling the SA may further include the following operations. After the offset elimination stage of the SA, the offset voltage of the amplifier module that is stored by the load compensation unit is eliminated. In a first amplification process of the amplification stage of the SA, voltages on a first bit line and a second bit line are amplified. In a second amplification process of the amplification stage of the SA, the offset voltage storage unit and the load compensation unit are controlled to be shorted.

According to the exemplary embodiment of the disclosure, the amplifier module may include a first NMOS transistor and a second NMOS transistor; and the method for controlling the SA may further include the following operation. In the amplification stage of the SA, based on the offset voltage stored in the offset voltage storage unit, the voltages of the first bit line and the second bit line are inhibited from being wrongly amplified due to inconsistency of at least two transistors in the amplifier module.

According to the exemplary embodiment of the disclosure, a working stage of the SA may further include a pre-charging stage; and the method for controlling the SA may further include the following operation. In the pre-charging stage of the SA, the first bit line and the second bit line are pre-charged.

According to the exemplary embodiment of the disclosure, the method for controlling the SA may further include the following operation. When the SA is in the offset elimination stage, a pre-charging operation during the pre-charging stage is controlled to be executed.

Details of the method for controlling the SA in the exemplary embodiment of the disclosure have been described in the above process of describing the SA, and will not be repeated herein.

Further, the disclosure further provides a memory. The memory may include the above SA.

With the SA in the exemplary embodiment of the disclosure, the error rate of reading of the memory is reduced, the reading speed is improved, and the power consumption of reading is reduced. Therefore, the performance of the memory is greatly improved.

In the technical solutions provided by some embodiments of the disclosure, on one hand, by configuring the offset voltage storage unit, the offset voltage of the amplifier module in the SA may be stored in the offset voltage storage unit in the offset elimination stage of the SA. Therefore, when the data on the bit line needs to be read, offset compensation of the SA may be implemented by virtue of the offset voltage stored in the offset voltage storage unit, and the influence of the misalignment voltage caused by mismatch of the transistors on reading the data of the bit line is reduced to a great extent, thereby improving the performance of the semiconductor memory. On the other hand, by configuring the load compensation unit, it may be ensured that in the amplification stage of the SA, an adverse effect on a load of the SA due to introduction of the offset voltage storage unit is prevented, and the problem of reading the data in error due to the inconsistency of loads on the first bit line and the second bit line is prevented, thereby improving an accuracy of the reading, and further improving the performance of the semiconductor memory.

Other embodiments of the disclosure will be apparent to those skilled in the art from consideration of the specification and practice of the disclosure disclosed herein. This application is intended to cover any variations, uses, or adaptations of the disclosure following the general principles thereof and including such departures from the disclosure as come within known or customary practice in the art. The specification and embodiments are considered as exemplary only, with a true scope and spirit of the disclosure being indicated by the claims.

It will be appreciated that the disclosure is not limited to the exact construction that has been described above and illustrated in the accompanying drawings, and that various modifications and changes may be made without departing from the scope thereof. The scope of the disclosure is limited only by the appended claims.

The invention claimed is:

1. A Sense Amplifier (SA), comprising:
an amplifier circuit;
an offset voltage storage circuit electrically connected to the amplifier circuit, and configured to store an offset voltage of the amplifier circuit in an offset elimination stage of the SA; and
a load compensation circuit electrically connected to the amplifier circuit, and configured to compensate a difference between loads of the amplifier circuit in an amplification stage of the SA,
wherein the amplifier circuit comprises:
a first P-channel Metal Oxide Semiconductor (PMOS) transistor;
a second PMOS transistor, a source of the second PMOS transistor being connected to a source of the first PMOS transistor;
a first N-channel Metal Oxide Semiconductor (NMOS) transistor, a drain of the first NMOS transistor being connected to a drain of the first PMOS transistor and a first end of the offset voltage storage circuit, and a gate of the first NMOS transistor being connected to a gate of the first PMOS transistor; and
a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second end of the offset voltage storage circuit,
wherein in the offset elimination stage of the SA, the first PMOS transistor and the second PMOS transistor are configured as a current mirror, and each of the first NMOS transistor and the second NMOS transistor is configured as a diode connection mode, to store the offset voltage of the amplifier circuit in the offset voltage storage circuit.

2. The SA of claim 1, wherein the drain of the first PMOS transistor and the drain of the first NMOS transistor are connected to a first node, and the drain of the second PMOS transistor and the drain of the second NMOS transistor are connected to a second node; and the SA further comprises:
a first switch, a first end of the first switch being connected to the first node, and a second end of the first switch being connected to the gate of the first NMOS transistor;
a second switch, a first end of the second switch being connected to the second node, and a second end of the second switch being connected to the gate of the second NMOS transistor; and
a third switch, a first end of the third switch being connected to the gate of the first PMOS transistor, and a second end of the third switch being connected to a gate of the second PMOS transistor,
wherein in the offset elimination stage of the SA, the first switch, the second switch and the third switch are all in a closed state.

3. The SA of claim 2, further comprising:
a pull-up circuit, configured to control, in response to a pull-up control signal, a connected state of the source of the first PMOS transistor with a power voltage; and
a pull-down circuit, configured to control, in response to a pull-down control signal, whether the source of the first NMOS transistor is grounded,
wherein in the offset elimination stage of the SA, the source of the first PMOS transistor is connected to the power voltage, and the source of the first NMOS transistor is grounded.

4. The SA of claim 3, further comprising:
a fourth switch, a first end of the fourth switch being connected to the gate of the first NMOS transistor, and a second end of the fourth switch being connected to the second node; and
a fifth switch, a first end of the fifth switch being connected to the gate of the second PMOS transistor, and a second end of the fifth switch being connected to the gate of the second NMOS transistor,
wherein in the offset elimination stage of the SA, the fifth switch is open.

5. The SA of claim 4, further comprising:
a sixth switch, a first end of the sixth switch being connected to a first bit line, and a second end of the sixth switch being connected to the first node; and
a seventh switch, a first end of the seventh switch being connected to a second bit line, and a second end of the seventh switch being connected to the second node,
wherein in the offset elimination stage of the SA, both the sixth switch and the seventh switch are open.

6. The SA of claim 5, wherein a first end of the load compensation circuit is connected to the gate of the first NMOS transistor, and a second end of the load compensation circuit is connected to the second node,
wherein in the offset elimination stage of the SA, the fourth switch is open, and the load compensation circuit is configured to store the offset voltage of the amplifier circuit.

7. The SA of claim 6, wherein after the offset elimination stage of the SA, the fourth switch is closed, to eliminate the offset voltage of the amplifier circuit that is stored in the load compensation circuit.

8. The SA of claim 7, wherein in an induction stage of the SA, a memory cell corresponding to the first bit line or a memory cell corresponding to the second bit line is turned on, the first switch, the second switch and the third switch are open, the source of the first PMOS transistor is disconnected from the power voltage, the source of the first NMOS transistor is disconnected from ground, the fourth switch is open, the fifth switch, the sixth switch and the seventh switch are closed, to input voltages on the first bit line and the second bit line to the SA.

9. The SA of claim 8, wherein in the amplification stage of the SA, the source of the first PMOS transistor is connected to the power voltage, and the source of the first NMOS transistor is grounded, to amplify the voltages on the first bit line and the second bit line.

10. The SA of claim 9, further comprising:
an eighth switch, a first end of the eighth switch being connected to the first node, and a second end of the eighth switch being connected to the gate of the second NMOS transistor,
wherein in the offset elimination stage, the induction stage and a first amplification process of the amplification stage of the SA, the eighth switch is open; and in a second amplification process of the amplification stage of the SA, the fourth switch and the eighth switch are closed.

11. The SA of claim 5, further comprising:
a pre-charging circuit, configured to pre-charge the first bit line and the second bit line when the SA is in a pre-charging stage.

12. The SA of claim 11, wherein the pre-charging stage and the offset elimination stage are configured to be executed at a same time.

13. A memory, comprising a Sense Amplifier (SA), the SA comprising:
an amplifier circuit;
an offset voltage storage circuit electrically connected to the amplifier circuit, and configured to store an offset voltage of the amplifier circuit in an offset elimination stage of the SA; and
a load compensation circuit electrically connected to the amplifier circuit, and configured to compensate a difference between loads of the amplifier circuit in an amplification stage of the SA,
wherein the amplifier circuit comprises:
a first P-channel Metal Oxide Semiconductor (PMOS) transistor;
a second PMOS transistor, a source of the second PMOS transistor being connected to a source of the first PMOS transistor;
a first N-channel Metal Oxide Semiconductor (NMOS) transistor, a drain of the first NMOS transistor being connected to a drain of the first PMOS transistor and a first end of the offset voltage storage circuit, and a gate of the first NMOS transistor being connected to a gate of the first PMOS transistor; and a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second end of the offset voltage storage circuit,
wherein in the offset elimination stage of the SA, the first PMOS transistor and the second PMOS transistor are configured as a current mirror, and each of the first NMOS transistor and the second NMOS transistor is configured as a diode connection mode, to store the offset voltage of the amplifier circuit in the offset voltage storage circuit.

14. A method for controlling a Sense Amplifier (SA), the SA comprising an amplifier circuit, an offset voltage storage circuit and a load compensation circuit, wherein the amplifier circuit comprises: a first P-channel Metal Oxide Semiconductor (PMOS) transistor; a second PMOS transistor, a source of the second PMOS transistor being connected to a source of the first PMOS transistor; a first N-channel Metal Oxide Semiconductor (NMOS) transistor, a drain of the first NMOS transistor being connected to a drain of the first PMOS transistor and a first end of the offset voltage storage circuit, and a gate of the first NMOS transistor being connected to a gate of the first PMOS transistor; and a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second end of the offset voltage storage circuit,
the method for controlling the SA comprising:
configuring, in an offset elimination stage of the SA, the first PMOS transistor and the second PMOS transistor as a current mirror, and configuring each of the first NMOS transistor and the second NMOS transistor as a diode connection mode, to control an offset voltage of the amplifier circuit to be stored in the offset voltage storage circuit; and
compensating, in an amplification stage of the SA, a difference between loads of the amplifier circuit through the load compensation circuit.

15. The method for controlling the SA of claim 14, wherein in the offset elimination stage of the SA, the load compensation circuit stores the offset voltage of the amplifier circuit; and the method for controlling the SA further comprises:
eliminating, after the offset elimination stage of the SA, the offset voltage of the amplifier circuit that is stored in the load compensation circuit;
amplifying, in a first amplification process of the amplification stage of the SA, voltages on a first bit line and a second bit line; and
controlling, in a second amplification process of the amplification stage of the SA, the offset voltage storage circuit and the load compensation circuit to be shorted.

16. The method for controlling the SA of claim 14, further comprising:
inhibiting, in the amplification stage of the SA, based on the offset voltage stored in the offset voltage storage circuit, voltages on a first bit line and a second bit line from being wrongly amplified due to inconsistency of at least two transistors in the amplifier circuit.

17. The method for controlling the SA of claim 16, wherein a working stage of the SA further comprises a pre-charging stage; and the method for controlling the SA further comprises:
   pre-charging, in the pre-charging stage of the SA, the first bit line and the second bit line.

18. The method for controlling the SA of claim 17, further comprising:
   controlling, when the SA is in the offset elimination stage, to execute a pre-charging operation in the pre-charging stage.

\* \* \* \* \*